(12) United States Patent
Fu et al.

(10) Patent No.: US 8,988,073 B2
(45) Date of Patent: Mar. 24, 2015

(54) MAGNETORESISTIVE SENSOR

(75) Inventors: Nai-Chung Fu, Hsinchu County (TW); Fu-Tai Liou, Hsinchu County (TW)

(73) Assignee: Voltafield Technology Corporation, Jhubei (TW)

( * ) Notice: Subject to any disclaimer, the term of this patent is extended or adjusted under 35 U.S.C. 154(b) by 285 days.

(21) Appl. No.: 13/089,410

(22) Filed: Apr. 19, 2011

(65) Prior Publication Data

US 2012/0212218 A1 Aug. 23, 2012

(30) Foreign Application Priority Data

Feb. 22, 2011 (TW) .............................. 100105859 A

(51) Int. Cl.
*G01R 33/02* (2006.01)
*G01R 33/06* (2006.01)
*G01R 33/09* (2006.01)

(52) U.S. Cl.
CPC .................................. *G01R 33/093* (2013.01)
USPC ...................................... 324/252; 324/207.21

(58) Field of Classification Search
CPC .................. G01R 33/09–33/098; B82Y 25/00; H01L 43/08
USPC ................... 324/252, 207.21; 338/195, 32 R; 360/324.11, 324.12, 327.1–327.33
See application file for complete search history.

(56) References Cited

U.S. PATENT DOCUMENTS

| | | | | |
|---|---|---|---|---|
| 4,052,748 A | * | 10/1977 | Kuijk | 360/327.11 |
| 5,216,560 A | * | 6/1993 | Brug et al. | 360/327.33 |
| 6,048,739 A | * | 4/2000 | Hurst et al. | 438/3 |
| 6,417,572 B1 | * | 7/2002 | Chidambarrao et al. | 257/773 |
| 6,744,608 B1 | * | 6/2004 | Sin et al. | 360/324.2 |
| 7,037,604 B2 | * | 5/2006 | Witcraft | 428/816 |
| 7,084,024 B2 | * | 8/2006 | Gluschenkov et al. | 438/199 |
| 7,306,954 B2 | * | 12/2007 | Nejad et al. | 438/3 |
| 2003/0228756 A1 | * | 12/2003 | Lee et al. | 438/689 |
| 2004/0261253 A1 | * | 12/2004 | Yin et al. | 29/603.01 |
| 2005/0023581 A1 | * | 2/2005 | Nuetzel et al. | 257/295 |
| 2006/0102970 A1 | * | 5/2006 | Butcher et al. | 257/421 |
| 2006/0202291 A1 | * | 9/2006 | Kolb et al. | 257/421 |
| 2007/0200565 A1 | * | 8/2007 | Witcraft et al. | 324/252 |
| 2008/0100289 A1 | * | 5/2008 | Zimmer et al. | 324/252 |
| 2008/0258309 A1 | * | 10/2008 | Chiou et al. | 257/774 |

(Continued)

FOREIGN PATENT DOCUMENTS

CN 1454318 11/2003
JP 58136081 8/1983

(Continued)

*Primary Examiner* — Reena Aurora
(74) *Attorney, Agent, or Firm* — Ding Yu Tan

(57) ABSTRACT

A magnetoresistive sensor is provided. Specifically, multiple layers of or single layer of conductor line are formed at the same level as an insulating layer on a substrate as a bottom conductive layer. A magnetoresistive structure is formed on the bottom conductive layer and has opposite first surface and second surface. The second surface faces toward the substrate and is contacted with the bottom conductive layer. Afterward, another insulating layer is formed on the first surface, a slot is formed at the same level as the another insulating layer and a conductor line is formed in the slot and contacted with the first surface, so that one layer or multiple layers of conductor line can be formed as a top conductive layer. A lengthwise extending direction of each of the bottom and top conductor layers is intersected a lengthwise extending direction of the magnetoresistive structure with an angle.

14 Claims, 14 Drawing Sheets

(56) References Cited

U.S. PATENT DOCUMENTS

2009/0128282 A1\* 5/2009 Zimmer et al. ............. 338/32 R
2011/0163746 A1\* 7/2011 Zimmer et al. ............... 324/252

FOREIGN PATENT DOCUMENTS

| JP | 58139081 | 8/1983 |
|----|----------|--------|
| WO | 2008152915 | 12/2008 |

\* cited by examiner

MAGNETORESISTIVE SENSOR

FIELD OF THE INVENTION

The present invention relates to a magnetoresistive sensor, and more particularly to a magnetoresistive sensor with improved sensitivity.

BACKGROUND OF THE INVENTION

A magnetoresistive sensor is commonly applied to an electronic compass for finely sensing the magnetic field change of the earth. Such a type of magnetoresistive sensor generally need be equipped with a conductor, e.g. a barber-pole conductor, which facilitates the direction change of current flow inside the magnetoresistive material and thereby increases the sensitivity of the magnetoresistive sensor. FIG. 1 shows a schematic cross-sectional view of a conventional magnetoresistive sensor. As illustrated in FIG. 1, the conventional magnetoresistive sensor 100 primarily includes an insulating substrate 102, a magnetoresistive structure 104, and a layer of conductor lines 106. The magnetoresistive structure 104 includes a magnetoresistive layer 112 and a hard mask layer 114. The hard mask layer 114 is disposed on the magnetoresistive layer 112. The magnetoresistive structure 104 is disposed on the insulating substrate 102. After forming a metal layer (not shown) on the magnetoresistive structure 104, the layer of conductor lines 106 is formed by etching the metal layer.

FIG. 2 shows a schematic top view of the magnetoresistive sensor as shown in FIG. 1. As seen from FIG. 2, a lengthwise extending direction of the conductor lines 106 is intersected a lengthwise extending direction of the magnetoresistive structure 104 with an angle of about 45 degrees. The conductor lines 106 are electrically connected with the magnetoresistive structure 104 to form barber-pole conductors. During a conventional process of fabricating such a magnetoresistive sensor 100, since the magnetoresistive structure 104 is firstly formed on the insulating substrate 102 and then the conductor lines 106 are formed on the magnetoresistive structure 104, the hard mask layer 114 is necessarily used to resist from etching occurring while defining the conductor lines 106, so that the overall thickness becomes undesirably large, resulting in degraded sensitivity of the magnetoresistive sensor 100.

SUMMARY OF THE INVENTION

Therefore, an objective of the present invention is to provide a magnetoresistive sensor with improved sensitivity for sensing a change of external magnetic field.

In order to achieve the objective, a magnetoresistive sensor of the present invention primarily may have two types of structures, one type of structure is that a conductor line is formed prior to a magnetoresistive structure, and the other type of structure is that a conductor line is formed posterior to a magnetoresistive structure. In addition, the combination of the two types of structures also is provided, i.e., the magnetoresistive structure is formed between the two conductor lines.

As to the type of structure that the conductor line is formed prior to the magnetoresistive structure, several exemplary embodiments will be described as follows.

More specifically, a magnetoresistive sensor in accordance with an embodiment of the present invention includes a substrate, a first insulating layer, a first conductor line and a magnetoresistive structure. The first insulating layer is formed on the substrate. The first conductor line is formed at a level of (i.e., generally formed in) the first insulating layer. The first conductor line has opposite first surface and second surface. The first surface faces toward the substrate. The magnetoresistive structure is formed on the first insulating layer and at the side of the second surface of the first conductor line. A lengthwise extending direction of the magnetoresistive structure is intersected a lengthwise extending direction of the first conductor line with a first angle. The first angle is greater than or equal to 0 degree and smaller than or equal to 90 degrees. The magnetoresistive structure is electrically connected with the first conductor line.

A magnetoresistive sensor in accordance with another embodiment of the present invention includes a substrate, a first insulting layer, a first conductor line, a magnetoresistive structure and a first via-filled or trench-filled conductor. The first insulating layer is formed on the substrate. The first conductor line is formed at a level of the first insulating layer. The first conductor line has a first surface and a second surface opposite to the first surface. The first surface faces toward the substrate. The magnetoresistive structure is formed on the first insulating layer and at the side of the second surface of the first conductor line. A lengthwise extending direction of the magnetoresistive structure is intersected a lengthwise extending direction of the first conductor line with a first angle. The first angle is greater than or equal to 0 degree and smaller than or equal to 90 degrees. The magnetoresistive structure is electrically connected with the first conductor line. The first via-filled or trench-filled conductor is formed at a level of the first insulating layer to electrically the magnetoresistive structure with the first conductor line.

In one embodiment, the magnetoresistive sensor in accordance with each of the above two embodiments further includes a second insulating layer and a second conductor line. The second insulating layer is formed between the substrate and the first surface of the first conductor line. The second conductor line is formed at a level of the second insulating layer. A lengthwise extending direction of the second conductor line is intersected the lengthwise extending direction of the magnetoresistive structure with a second angle. The second angle is greater than or equal to 0 degree and smaller than or equal to 90 degrees. The second conductor line is electrically connected with the first conductor line.

In one embodiment, the magnetoresistive sensor in accordance with each of the above two embodiments further includes a second via-filled or trench-filled conductor formed at a level of the second insulating layer. The second via-filled or trench-filled conductor is arranged between the first surface of the first conductor line and the second conductor line to electrically connect the first conductor line with the second conductor line.

In one embodiment, the magnetoresistive structure in accordance with each of the above two embodiments includes a magnetoresistance layer and a hard mask layer. The magnetoresistance layer is formed on the second surface of the first conductor line. The magnetoresistance layer is selected from the group consisting of an anisotropic magnetoresistance layer (AMR), a giant magnetoresistance layer (GMR), a tunneling magnetoresistance layer (TMR) and combinations thereof. The hard mask layer is formed on the magnetoresistance layer and away from the second surface of the first conductor line.

As to the other type of structure that the conductor line is formed posterior to the magnetoresistive structure, several exemplary embodiments will be described as follows.

In particular, a magnetoresistive sensor in accordance with an embodiment of the present invention includes a substrate, a magnetoresistive structure, a first insulating layer, a first conductor line, and a first via-filled or trench-filled conductor. The magnetoresistive structure is formed on the substrate. The magnetoresistive structure has a first surface and a second surface opposite to the first surface. The first surface faces toward the substrate. The first insulating layer is formed on the second surface of the magnetoresistive structure. The first conductor line is formed at a level of the first insulating layer. A lengthwise extending direction of the first conductor line is intersected a lengthwise extending direction of the magnetoresistive structure with a first angle. The first angle is greater than or equal to 0 degree and smaller than or equal to 90 degrees. The first conductor line is electrically connected with the magnetoresistive structure through the first via-filled or trench-filled conductor.

In one embodiment, the magnetoresistive sensor further includes a second insulating layer and a second conductor line. The second insulating layer is formed on both the first insulating layer and the first conductor line. The second conductor line is formed at a level of the second insulating layer. A lengthwise extending direction of the second conductor line is intersected the lengthwise extending direction of the magnetoresistive structure with a second angle. The second angle is greater than or equal to 0 degree and smaller than or equal to 90 degrees. The second conductor line is electrically connected with the first conductor line.

In one embodiment, the magnetoresistive sensor further includes a second via-filled or trench-filled conductor formed at a level of the second insulating layer. The second via-filled or trench-filled conductor is arranged between the first conductor line and the second conductor line to electrically connect the first conductor line with the second conductor line.

A magnetoresistive sensor in accordance with another embodiment of the present invention includes a substrate, a magnetoresistive structure, a first insulating layer, a first conductor line, a second insulating layer and a second conductor line. The magnetoresistive structure is formed on the substrate and has opposite first surface and second surface. The first surface faces toward the substrate. The first insulating layer is formed on the second surface of the magnetoresistive structure. The first conductor line is formed at a level of the first insulating layer. A lengthwise extending direction of the first conductor line is intersected a lengthwise extending direction of the magnetoresistive structure with a first angle. The first angle is greater than or equal to 0 degree and smaller than or equal to 90 degrees. The first conductor line is electrically connected with the magnetoresistive structure. The second insulating layer is formed on both the first insulating layer and the first conductor line. The second conductor line is formed at a level of the second insulating layer. A lengthwise extending direction of the second conductor line is intersected the lengthwise extending direction of the magnetoresistive structure with a second angle. The second angle is greater than or equal to 0 degree and smaller than or equal to 90 degrees. The second conductor line is electrically connected with the first conductor line.

In one embodiment, the magnetoresistive structure includes a magnetoresistance layer and a hard mask layer. The magnetoresistance layer is formed on the substrate. The magnetoresistance layer is selected from the group consisting of an anisotropic magnetoresistance layer, a giant magnetoresistance layer, a tunneling magnetoresistance layer and combinations thereof. The hard mask layer is formed on the magnetoresistance layer.

As to the combination of the above two types of structures that the magnetoresistive structure is formed between two conductor lines, an exemplary embodiment will be described as follow.

Specifically, a magnetoresistive sensor in accordance with an embodiment of the present invention includes a magnetoresistive structure, a first insulating layer, a first conductor line, a second insulating layer and a second conductor line. The magnetoresistive structure has a first surface and a second surface. The first insulating layer is formed on the first surface of the magnetoresistive structure. The first conductor line is formed at a level of the first insulating layer. A lengthwise extending direction of the first conductor line is intersected a lengthwise extending direction of the magnetoresistive structure with a first angle. The first angle is greater than or equal to 0 degree and smaller than or equal to 90 degrees. The first conductor line is electrically connected with the magnetoresistive structure. The second insulating layer is formed on the second surface of the magnetoresistive structure. The second conductor line is formed at a level of the second insulating layer. A lengthwise extending direction of the second conductor line is intersected the lengthwise extending direction of the magnetoresistive structure with a second angle. The second angle is greater than or equal to 0 degree and smaller than or equal to 90 degrees. The second conductor line is electrically connected with the magnetoresistive structure.

In one embodiment, the magnetoresistive sensor further includes a third insulating layer and a third conductor line. The third insulating layer is formed on both the first insulating layer and the first conductor line. The third conductor line is formed at a level of the third insulating layer. A lengthwise extending direction of the third conductor line is intersected the lengthwise extending direction of the magnetoresistive structure with a third angle. The third angle is greater than or equal to 0 degree and smaller than or equal to 90 degrees. The third conductor line is electrically connected with the first conductor line.

In one embodiment, the magnetoresistive sensor further includes a fourth insulating layer and a fourth conductor line. The fourth insulating layer is formed on both the second insulating layer and the second conductor line. The fourth conductor line is formed at a level of the fourth insulating layer. A lengthwise extending direction of the fourth conductor line is intersected the lengthwise extending direction of the magnetoresistive structure with a fourth angle. The fourth angle is greater than or equal to 0 degree and smaller than or equal to 90 degrees. The fourth conductor line is electrically connected with the second conductor line.

In one embodiment, the magnetoresistive structure includes a magnetoresistance layer and a hard mask layer. The magnetoresistance layer is formed on the substrate. The magnetoresistance layer is selected from the group consisting of an anisotropic magnetoresistance layer, a giant magnetoresistance layer, a tunneling magnetoresistance layer and combinations thereof. The hard mask layer is formed on the magnetoresistance layer.

In one embodiment, the first insulating layer may further be formed with a first via-filled or trench-filled conductor therein. The first via-filled or trench-filled conductor is to electrically connect the magnetoresistive structure with the first conductor line. In another embodiment, the magnetoresistive structure is directly connected with the first conductor line instead. The second insulating layer may further be formed with a second via-filled or trench-filled conductor therein. The second via-filled or trench-filled conductor is to electrically connect the magnetoresistive structure with the second conductor line. In another embodiment, the magnetoresistive structure is directly connected with the second conductor line instead. The third insulating layer may further be formed with a third via-filled or trench-filled conductor therein to electrically connect the first conductor line with the third conductor line. The fourth insulating layer may further be formed with a fourth via-filled or trench-filled conductor therein to electrically connect the second conductor line with the fourth conductor line.

In one embodiment, each of the first conductor line, the second conductor line, the third conductor line, the fourth conductor line, the first via-filled or trench-filled conductor, the second via-filled or trench-filled conductor, the third via-filled or trench-filled conductor, and the fourth via-filled or trench-filled conductor is made of, for example aluminum, tungsten, copper or one of the combinations thereof. Each of the first insulating layer, the second insulating layer, the third insulating layer and the fourth insulating layer is, for example a silicon oxide layer or a silicon nitride layer.

For the magnetoresistive sensor of the present invention, since the general semiconductor devices such as the conductor line and/or the via-filled or trench-filled conductor are firstly formed on the substrate, the metallic pollution issue caused by the magnetic material such as iron, cobalt and nickel in subsequent process during the conventional fabrication process of magnetoresistive sensor can be avoided, and the influence of magnetoresistive structure reliability caused by the change of temperature and/or stress in the subsequent process, the etching process or the lithography process also can be avoided.

Moreover, in the magnetoresistive sensor of the present invention, the hard mask layer only is needed for defining the magnetoresistance layer and no longer needed to resist from the etching of defining the conductor line, and therefore the hard mask layer may have a thinner thickness with respect to that in the conventional magnetoresistive structure. Accordingly, the magnetoresistive structure with a thinner hard mask layer can improve the sensitivity of sensing the change of external magnetic field.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 3A:
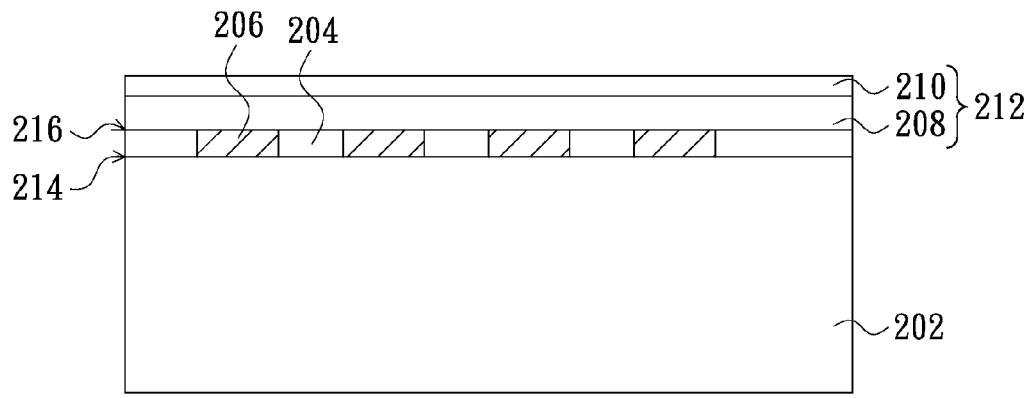
FIG. 3A shows a schematic cross-sectional view of a magnetoresistive sensor in accordance with a first implementation of a first embodiment of the present invention.

In a first implementation of a first embodiment of the present invention as illustrated in FIG. 3A, the magnetoresistive sensor 200 includes a substrate 202, a first insulating layer 204, first conductor lines 206 and a magnetoresistive structure 212. The first insulating layer 204 is formed on the substrate 202. The first conductor lines 206 are arranged in the form of single layer and formed at the same level as the first insulating layer 204. The layer of first conductor lines 206 has a first surface 214 and a second surface 216 opposite to each other, and the first surface 214 faces toward the substrate 202. The magnetoresistive structure 212 is formed on the first insulating layer 204 and at the side of the second surface 216 of the layer of first conductor lines 206. The magnetoresistive structure 212 includes a magnetoresistive layer 208 and a hard mask layer 210. The magnetoresistive layer 208 is formed on the second surface 216 of the layer of first conductor lines 206, and the hard mask layer 210 is formed on the magnetoresistive layer 208 and opposite to (i.e., generally away from) the second surface 216 of the layer of first conductor lines 206. Generally, the magnetoresistive layer 208 is selected from, but not limited to, the group comprised of an anisotropic magnetoresistive (AMR) layer, a giant magnetoresistive (GMR) layer, a tunneling magnetoresistive (TMR) layer and any of combinations thereof.

Figure 3B:
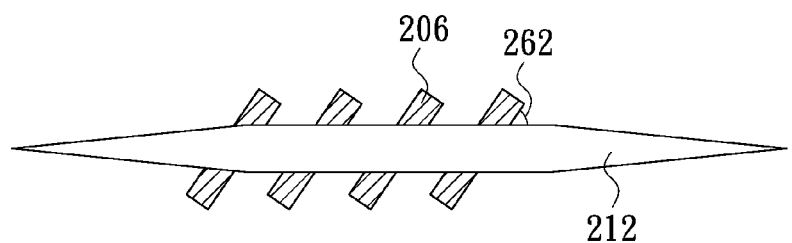
FIG. 3B shows a schematic top view of the magnetoresistive sensor as shown in FIG. 3A.

In order to accurately measure the change of external magnetic field, a top view of the magnetoresistive sensor 200 as illustrated in FIG. 3B is provided according to the first implementation of the first embodiment of the present invention and described hereinafter. As illustrated in FIG. 3B, a lengthwise extending direction (i.e., the horizontal direction in FIG. 3B) of the magnetoresistive structure 212 is intersected a lengthwise extending direction of the first conductor lines 206 with a first angle 262, and the first angle 262 is greater than or equal to 0 degree and smaller than or equal to 90 degrees. The magnetoresistive structure 212 is electrically connected with the first conductor lines 206. Moreover, the shape and configuration of the magnetoresistive structure 212 is not limited to those as illustrated in FIG. 3B, and may be any other suitable shape and configuration.

Figure 4A:
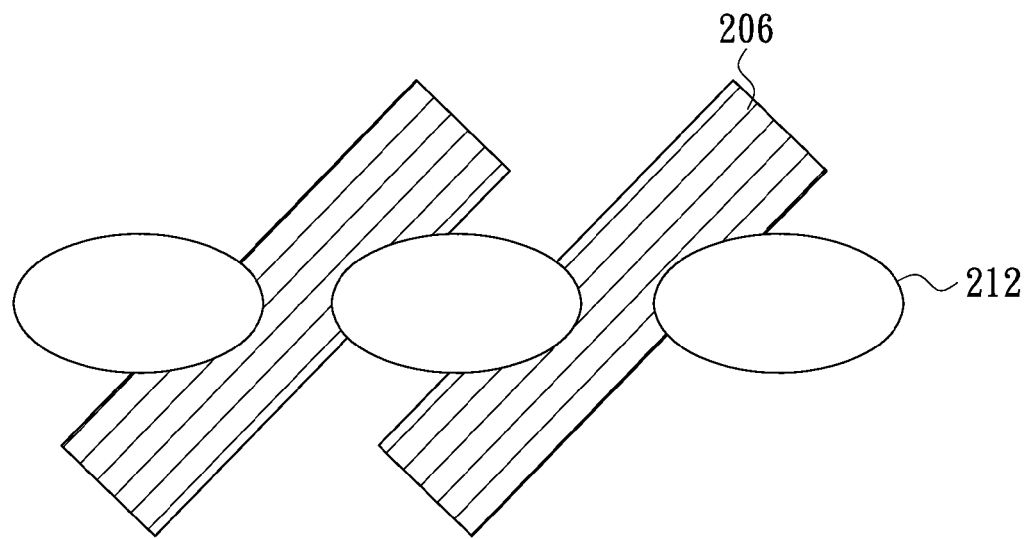
FIG. 4A shows a schematic top view of a magnetoresistive sensor in accordance with a second implementation of the first embodiment of the present invention.

For example, as illustrated in FIG. 4A according to a second implementation of the first embodiment of the present invention, the magnetoresistive structure 212 can be a discontinuous elliptical structure while the discrete elliptical portions of the magnetoresistive structure 212 are electrically interconnected with the first conductor lines 206.

Figure 4B:
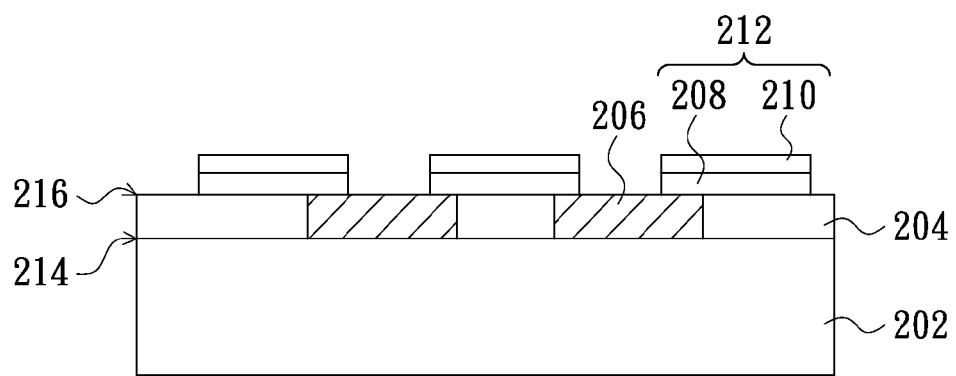
FIG. 4B shows a schematic cross-sectional view of the magnetoresistive sensor as shown in FIG. 4A.

FIG. 4B shows a schematic cross-sectional view of the magnetoresistive sensor in FIG. 4A. As illustrated in FIG. 4B, the first insulating layer 204 is formed on the substrate 202, and the first conductor lines 206 are formed at the same level as the first insulating layer 204 and arranged in the form of single layer. The layer of first conductor lines 206 has a first surface 214 and a second surface 216 opposite to each other. The first surface 214 faces toward the substrate 202. The discontinuous magnetoresistive structure 212 (including the magnetoresistive layer 208 and the hard mask layer 210) is formed on the first insulating layer 204 and at the side of the second surface 216 of the layer of first conductor lines 206. The discontinuous portions of the magnetoresistive structure 212 are electrically interconnected with the first conductor lines 206.

In the following, materials, structures and fabrication of the elements or parts with numeral references the same as those shown in the above-described figures are the same or similar to those used in the foregoing embodiments and thus will not be repeatedly described.

Figure 5A:
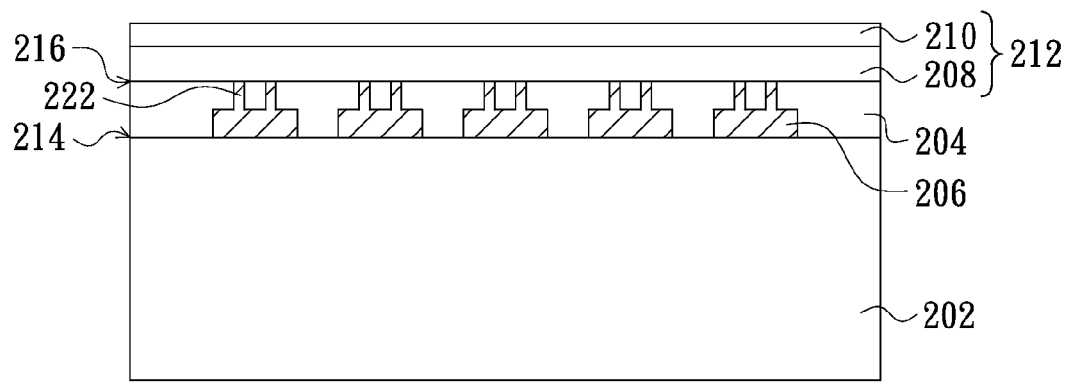
FIGS. 5A and 5B show schematic cross-sectional views of magnetoresistive sensors in accordance with third and fourth implementations of the first embodiment of the present invention.
Figure 5B:
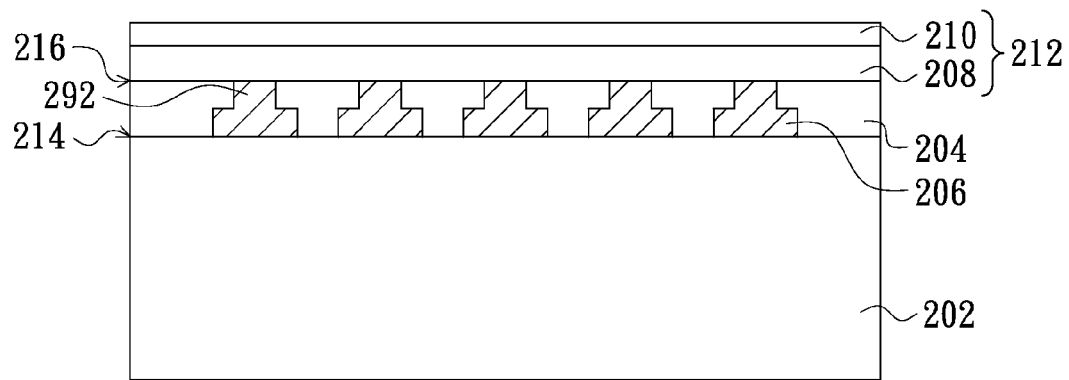

Except the first conductor lines 206 are directly electrically connected with the magnetoresistive structure 212, in order to improve the planarization effect of a contact interface between the first conductor line 206 and the magnetoresistive structure 212 and thereby achieve better magnetoresistive characteristic, as illustrated FIG. 5A associated with a third implementation of the first embodiment of the present invention, the first conductor lines 206 can be electrically connected with the magnetoresistive structure 212 by multiple first via-filled conductors 222 penetrating through the first insulating layer 204. In addition, the first via-filled conductors 222 in FIG. 5A can be replaced by multiple first trench-filled conductors 292 as illustrated in FIG. 5B associated with a fourth implementation of the first embodiment instead.

Figure 5C:
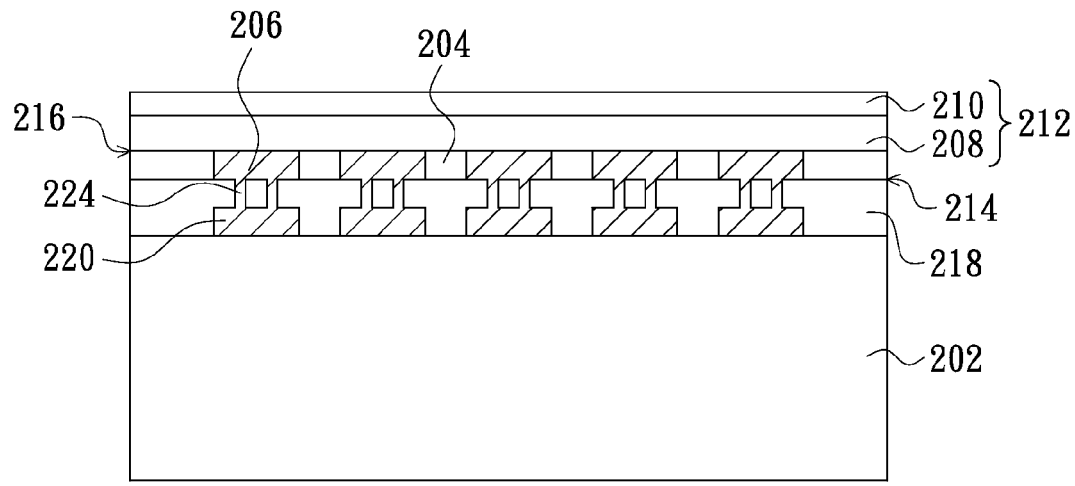
FIGS. 5C and 5D show schematic cross-sectional views of magnetoresistive sensors respectively in accordance with fifth and sixth implementations of the first embodiment of the present invention.

In order to improve the current shunt effect of the first conductor lines 206, the magnetoresistive sensor can be formed with multiple layers of conductor line, and the multiple layers of conductor line can be electrically connected in parallel to low the resistance thereof. FIG. 5C shows a schematic cross-sectional view of a magnetoresistive sensor in accordance with a fifth implementation of the first embodiment of the present invention. As illustrated in FIG. 5C, the magnetoresistive sensor 300 includes a second insulating layer 218 and second conductor lines 220, besides a first insulating layer 204, first conductor lines 206 and a magnetoresistive structure 212 all formed on the substrate 202. The second insulating layer 218 is formed between the substrate 202 and the first surface 214 of the layer of first conductor lines 206. The second conductor lines 220 are formed at the same level as the second insulating layer 218 and electrically connected with the first conductor lines 206. The second conductor lines 220 are arranged in the form of single layer. A lengthwise extending direction of the second conductor lines 220 is intersected a lengthwise extending direction of the magnetoresistive structure 212 with a second angle. The second angle is greater than or equal to 0 degree and smaller than or equal to 90 degrees.

Figure 5D:
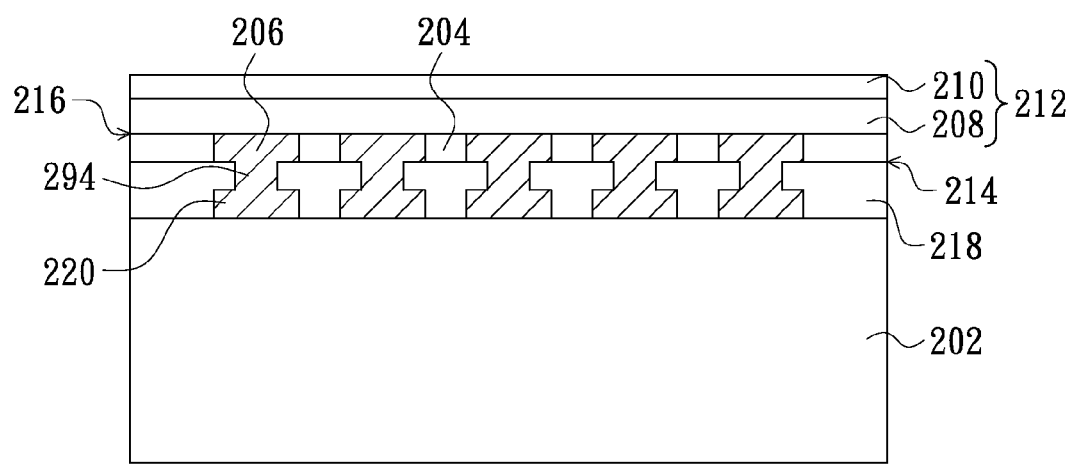

In addition, in order to improve the shunt effect of the first conductor lines 206 to thereby achieve the effects of lower resistance and more efficiency, the second insulating layer 218 further is formed with second via-filled conductors 224 therein to electrically connect the first conductor lines 206 with the second conductor lines 220. In a sixth implementation of the first embodiment, as illustrated in FIG. 5D, the first conductor lines 206 are electrically connected with the second conductor lines 220 by multiple second trench-filled conductors 294 instead.

Figure 5E:
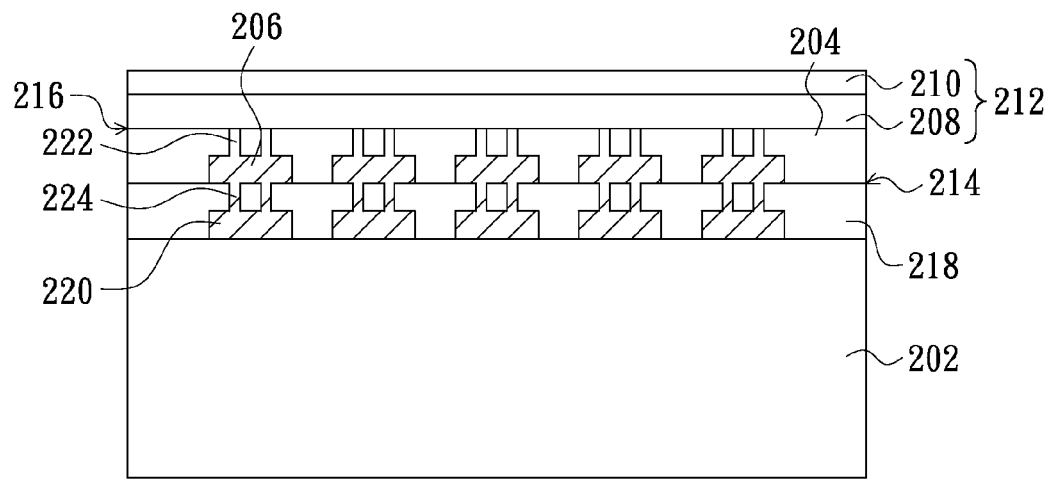
FIGS. 5E and 5F show schematic cross-sectional views of magnetoresistive sensors respectively in accordance with seventh and eighth implementations of the first embodiment of the present invention.

FIG. 5E shows a schematic cross-sectional view of a magnetoresistive sensor in accordance with a seventh implementation of the first embodiment of the present invention. As illustrated in FIG. 5E, in order to improve planarization effect of a contact interface between the first conductor lines 206 and the magnetoresistive structure 212 to thereby achieve better magnetoresistive characteristic, besides the shunt effect of the first conductor line 206 is improved, in the magnetoresistive sensor 400, the first insulating layer 204 also is formed with first via-filled conductors 222 therein to electrically connect the magnetoresistive structure 212 with the first conductor lines 206. The substrate 202 can be an insulating substrate or other substrate with extremely large resistance. The material of the first conductor lines 206, the second conductor lines 220, the first via-filled conductor 222 and the second via-filled conductors 224 can be aluminum (Al), tungsten (W), or copper (Cu) and so on, or one of the combinations thereof. The first insulating layer 204 and the second insulating layer 218 can be silicon oxide layers or silicon nitride layers, etc.

Figure 5F:
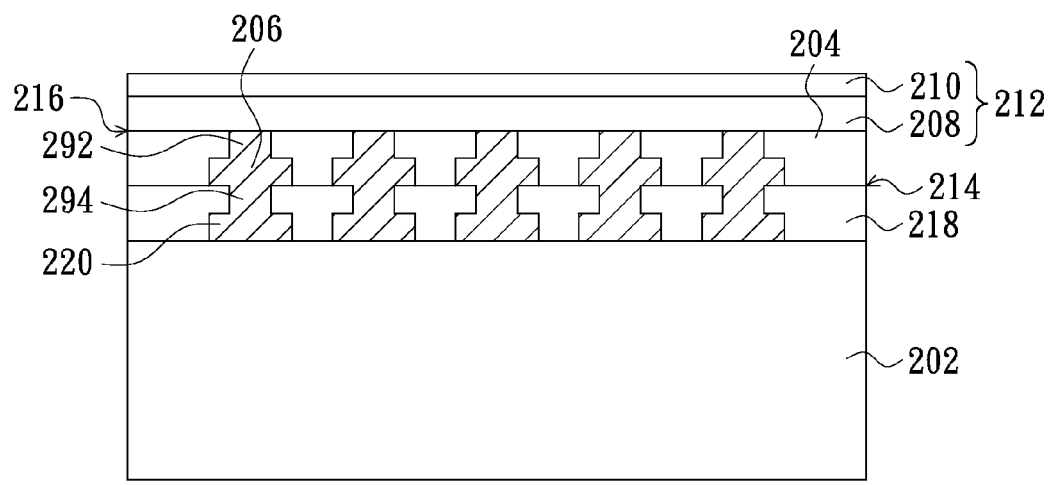

In the illustrative embodiment, although the examples of the second insulating layer 218 formed with the second via-filled/trench-filled conductors 224/294 therein and/or the first insulating layer 204 formed with the first via-filled conductors 222 therein are taken to illustrate the structures of the respective magnetoresistive sensors 300, 400, the amount and size of via-filled/trench-filled conductors of the present invention are not limited to these. In addition, as illustrated in FIG. 5F associated with an eighth implementation of the first embodiment, first trench-filled conductors 292 and second trench-filled conductors 294 are formed to achieve the electrical connections among the magnetoresistive structure 212, the first conductor lines 206 and the second conductor lines 220.

In the illustrative implementations associated with FIGS. 5A through 5F, the magnetoresistive structure 212 is without any conductor line formed thereabove and is formed with one layer or two layers of conductor line therebelow to illustrate the structure of the magnetoresistive sensor of the present invention. However, the amount of the layers of conductor line in the illustrative embodiments is not limited to these, and much more layers of conductor line can be formed below the magnetoresistive layer 208 in sequence.

Since in the first embodiment of the present invention associated with FIGS. 3 through 5, the general semiconductor devices such as the conductor lines and/or via-filled/trench-filled conductors are firstly formed on the substrate 202, and then the semiconductor devices with the substrate 202 together are loaded in a machine for the fabrication of the magnetoresistive structure 212 on the first conductor lines 206, which can avoid the metallic pollution issue of magnetic material such as iron (Fe), cobalt (Co) and nickel (Ni) in the machine for performing subsequent process after the magnetoresistive structure 104 is firstly formed on the substrate 102 in the prior art (see FIG. 1), and also can avoid the change of temperature and/or stress in the subsequent process, the etching process or the lithography process to influence the reliability of the magnetoresistive structure 212.

Moreover, in the illustrative first embodiment, since the first insulating layer 204 is firstly formed on the substrate 202, the first conductor lines 206 are formed at the same level as the first insulating layer 204, and then the magnetoresistive structure 212 is formed on both the first insulating layer 204 and the first conductor lines 206, the hard mask layer 210 in the magnetoresistive structure 212 is no longer needed to provide the function of electrically connecting the magnetoresistive structure 212 to the first conductor lines 206 like the hard mask layer in the prior art, and thus the material of the hard mask layer 210 in the illustrative embodiment is not limited to a conductive material and can be an insulating material instead to dramatically reduce the shunt effect of the hard mask layer and improve the magnetoresistance ratio. Furthermore, since the hard mask layer 210 is only needed to define the magnetoresistive layer 208 and no longer needed to resist from the etching of defining the conductor lines, the thickness of the hard mask layer 210 can be reduced and thus can be thinner than the hard mask layer 114 of the conventional magnetoresistive structure 104 (see FIG. 1). Accordingly, the magnetoresistive layer 208 cooperative with the thinner hard mask layer 210 can improve the sensitivity of sensing the change of external magnetic field.

Figure 6:
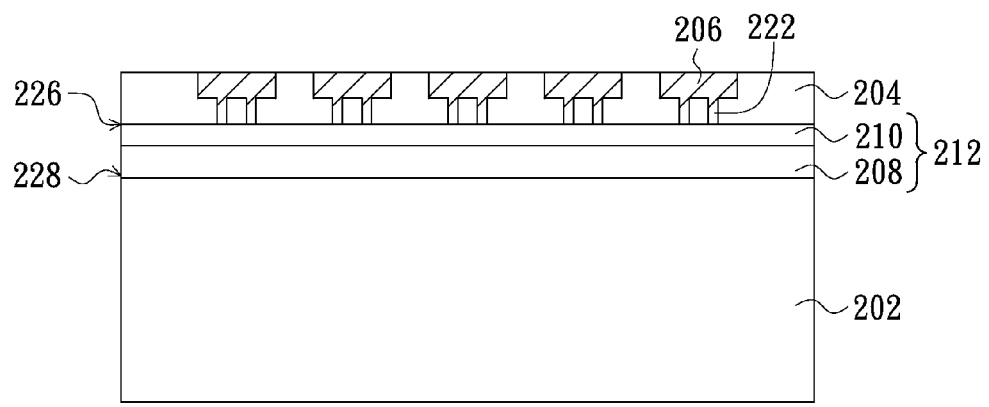
FIG. 6 shows a schematic cross-sectional view of a magnetoresistive sensor in accordance with a first implementation of a second embodiment of the present invention.
Figure 7:
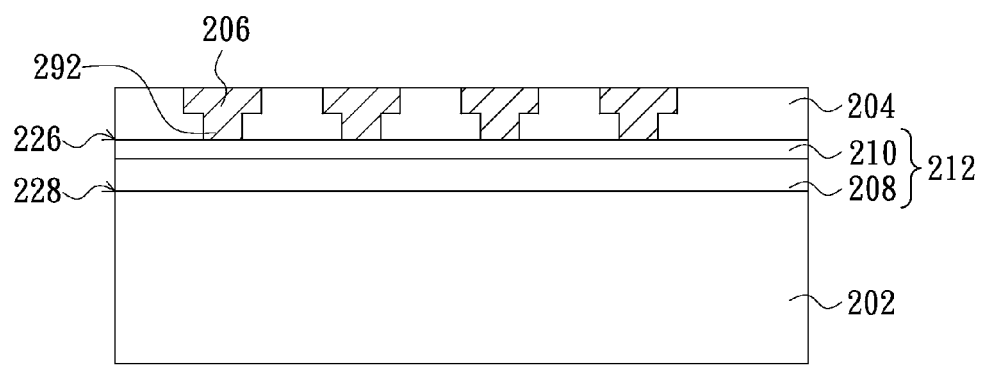
FIG. 7 shows a schematic cross-sectional view of a magnetoresistive sensor in accordance with a second implementation of the second embodiment of the present invention.

In a second embodiment of the present invention, in order to improve the sensitivity of the magnetoresistive layer 208 sensing the change of external magnetic field, the magnetoresistive structure 212 also is given a relatively thin hard mask layer 210. FIG. 6 shows a schematic cross-sectional view of a magnetoresistive sensor in accordance with a first implementation of the second embodiment of the present invention. As illustrated in FIG. 6, the magnetoresistive sensor 500 includes a substrate 202, a magnetoresistive structure 212, a first insulating layer 204, first conductor lines 206 and first via-filled conductors 222. The magnetoresistive structure 212 is firstly formed on the substrate 202. The magnetoresistive structure 212 includes a magnetoresistive layer 208 and a hard mask layer 210. The magnetoresistive layer 208 is formed on the substrate 202 and has opposite first surface 228 and second surface 226. The first surface 228 faces toward the substrate 202. The first insulating layer 204 is formed on the second surface 226 of the magnetoresistive structure 212. The first conductor lines 206 is formed at the same level as the first insulating layer 204 and arranged in the form of single layer. A lengthwise extending direction of the first conductor lines 206 is intersected a lengthwise extending direction of the magnetoresistive structure 212 with a first angle. The first angle is greater than or equal to 0 degree and smaller than or equal to 90 degrees. The first insulating layer 204 further is formed with the first via-filled conductors 222 therein to electrically connect the magnetoresistive structure 212 with the first conductor lines 206. Since the magnetoresistive sensor 500 is not needed to etch any metal layer, additional buffer layer or etching selectivity material layer and thick hard mask layer are not needed, and only a relatively thin hard mask layer instead is needed to resist from the etching of defining the vias. Compared with the conventional magnetoresistive sensor, the present magnetoresistive sensor is formed with a relatively thin hard mask layer, so that the sensitivity of sensing the change of external magnetic field can be improved. In a second implementation of the second embodiment, the first via-filled conductors 222 in FIG. 6 can be replaced by first trench-filled conductors 292 as illustrated in FIG. 7.

Figure 8A:
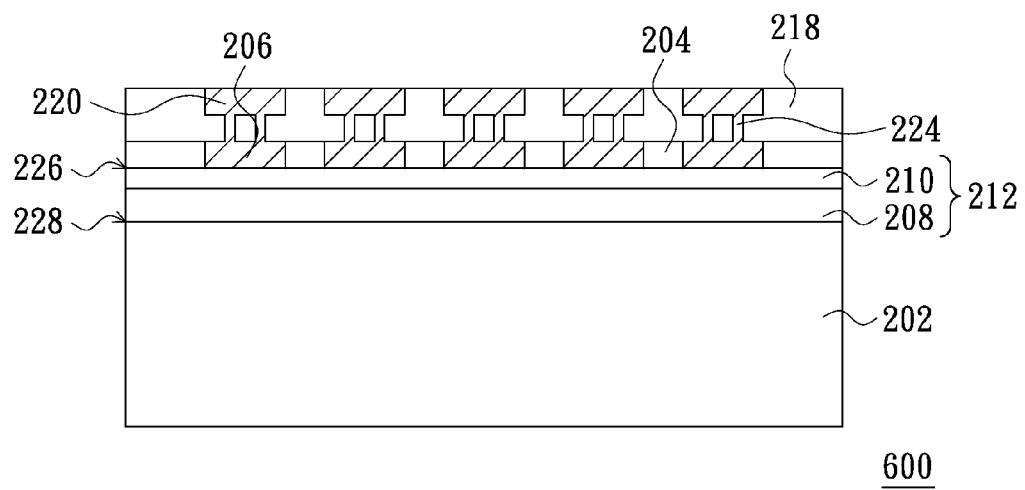
FIGS. 8A and 8B show schematic cross-sectional views of magnetoresistive sensors respectively in accordance with third and fourth implementations of the second embodiment of the present invention.
Figure 8B:
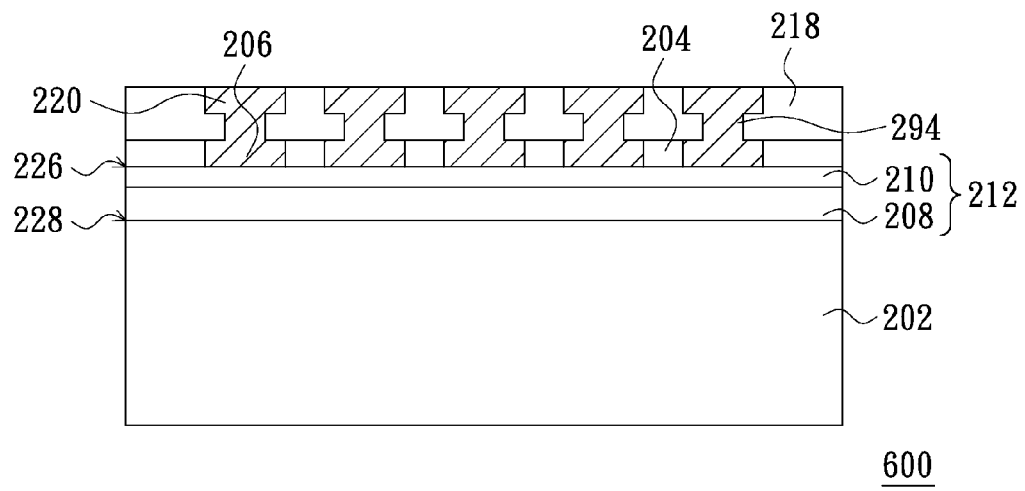

In addition, in order to improve the current shunt effect of the first conductor lines 206, the magnetoresistive sensor can be given with multiple layers of conductor line electrically connected in parallel. FIG. 8A shows a schematic cross-sectional view of a magnetoresistive sensor in accordance with a third implementation of the second embodiment of the present invention. As illustrated in FIG. 8A, the magnetoresistive sensor 600 includes a second insulating layer 218 and second conductor lines 220, besides a magnetoresistive structure 212, a first insulating layer 204 and first conductor lines 206 all formed on the substrate 202. The second insulating layer 218 is formed on both the first insulating layer 204 and the first conductor lines 206. The second conductor lines 220 are formed at the same level as the second insulating layer 218 and arranged in the form of single layer. A lengthwise extending direction of the second conductor lines 220 is intersected a lengthwise extending direction of the magnetoresistive structure 212 with a second angle. The second angle is greater than or equal to 0 degree and smaller than or equal to 90 degrees. Furthermore, the second insulating layer 218 further is formed with second via-filled conductors 224 therein. The second conductor lines 220 are electrically connected to the first conductor lines 206 by the second via-filled conductors 224. In addition, in a fourth implementation of the second embodiment, the second via-filled conductors 224 in FIG. 8A can be replaced by second trench-filled conductors 294 as illustrated in FIG. 8B.

Figure 9A:
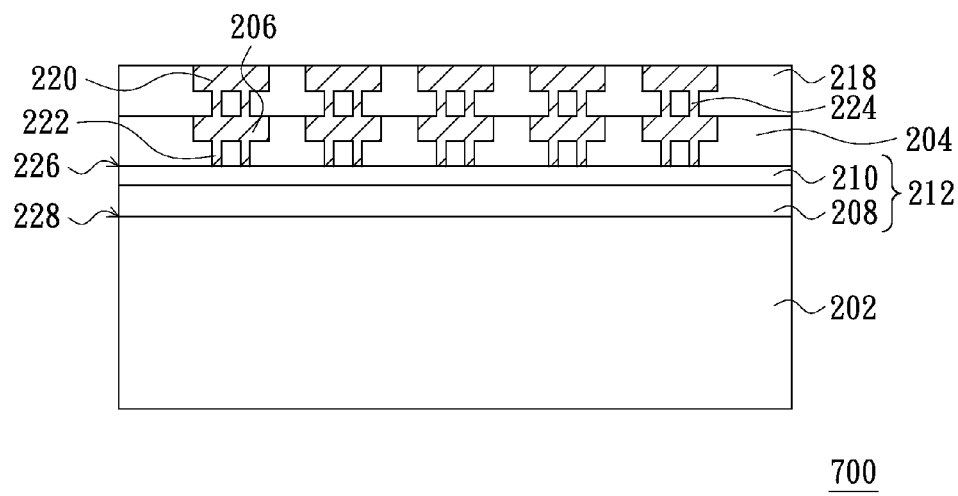
FIGS. 9A and 9B show schematic cross-sectional views of magnetoresistive sensors respectively in accordance with fifth and sixth implementations of the second embodiment of the present invention.

FIG. 9A shows a schematic cross-sectional view of a magnetoresistive sensor in accordance with a fifth implementation of the second embodiment of the present invention. As illustrated in FIG. 9A, in order to improve the sensitivity of the magnetoresistive layer 208 for sensing the change of external magnetic field and meanwhile achieve the foregoing advantages, in the magnetoresistive sensor 700, the magnetoresistive structure 212 is desirably formed with a relatively thin hard mask layer 210, and the first insulating layer 204 is further formed with first via-filled conductors 222 therein to electrically connect the magnetoresistive structure 212 with the first conductor lines 206. The substrate 202 can be an insulating substrate or other substrate with extremely large resistance. The first conductor lines 206, the second conductor lines 220, the first via-filled conductors 222 and the second via-filled conductors 224 may be made of aluminum, tungsten, or copper and so on, or one of combinations thereof. The first insulating layer 204 and the second insulating layer 218 may be silicon oxide layers or silicon nitride layers, etc.

Figure 9B:
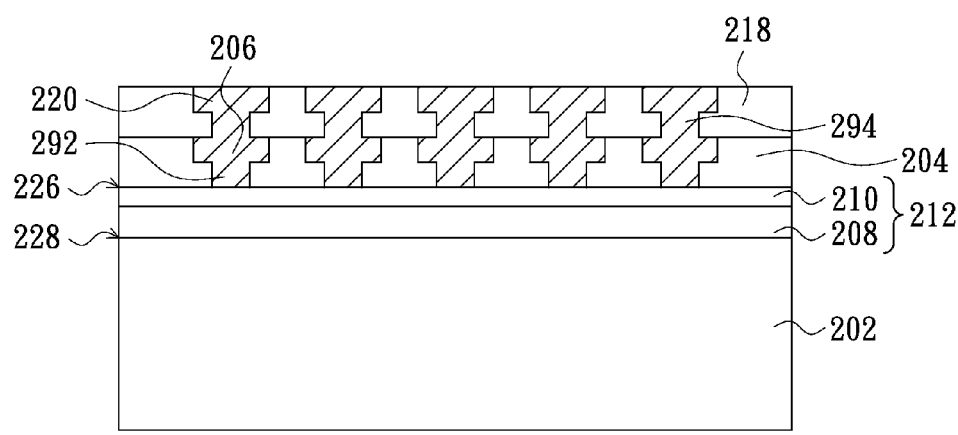

In the illustrative fifth implementation, the example of the first insulating layer 204 formed with the first via-filled conductors 222 and the second insulating layer 218 formed with the second via-filled conductors 224 is taken to illustrate the structure of the magnetoresistive sensor 700, but the amounts and sizes of the via-filled conductors 222, 224 herein are not to limit the present invention. In addition, in a sixth implementation of the second embodiment, as illustrated in FIG. 9B, first trench-filled conductors 292 and second trench-filled conductors 294 instead are formed to achieve the electrical connections among the magnetoresistive structure 212, the first conductor lines 206 and the second conductor lines 220.

Figure 10A:
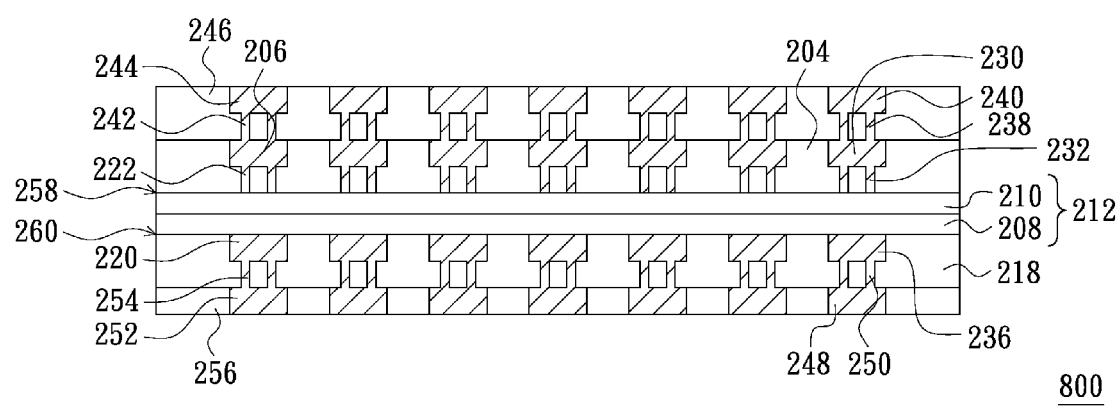
FIGS. 10A, 10B and 10C show schematic cross-sectional views of magnetoresistive sensors respectively in accordance with first through third implementations of a third embodiment of the present invention.

Moreover, a combination of the above first embodiment with the second embodiment can derive a third embodiment which will be illustrated below in detail. In particular, FIG. 10A shows a schematic cross-sectional view of a magnetoresistive sensor in accordance with a first implementation of the third embodiment of the present invention. As illustrated in FIG. 10A, the magnetoresistive sensor 800 includes a magnetoresistive structure 212, a first insulating layer 204, first conductor lines 206, a second insulating layer 218 and second conductor lines 220. The magnetoresistive structure 212 includes a magnetoresistive layer 208 and a hard mask layer 210. The hard mask layer 210 is formed on the magnetoresistive layer 208. The magnetoresistive structure 212 has a first surface 258 and a second surface 260. The first insulating layer 204 is formed on the first surface 258 of the magnetoresistive structure 212. The first conductor lines 206 are formed at the same level as the first insulating layer 204 and arranged in the form of single layer. A lengthwise extending direction of the first conductor lines 206 is intersected a lengthwise extending direction of the magnetoresistive structure 212 with a first angle. The first angle is greater than or equal to 0 degree and smaller than or equal to 90 degrees. The first conductor lines 206 are electrically connected with the magnetoresistive structure 212.

The second insulating layer 218 is formed on the second surface 260 of the magnetoresistive structure 212. The second conductor lines 220 are formed at the same level as the second insulating layer 218 and arranged in the form of single layer. A lengthwise extending direction of the second conductor lines 220 is intersected the lengthwise extending direction of the magnetoresistive structure 212 with a second angle. The second angle is greater than or equal to 0 degree and smaller than or equal to 90 degrees. The second conductor lines 220 are electrically connected with the magnetoresistive structure 212.

In order to improve the current shunt effect of conductor lines to thereby improve the efficiency of the magnetoresistive sensor 800, the magnetoresistive sensor 800 would be given with multiple layers of conductor line electrically connected in parallel. Accordingly, the magnetoresistive sensor 800 further includes a third insulating layer 246, third conductor lines 244, a fourth insulating layer 256 and fourth conductor lines 252. The third insulating layer 246 is formed on both the first insulating layer 204 and the first conductor lines 206. The third conductor lines 244 are formed at the same level as the third insulating layer 246 and arranged in the form of single layer. A lengthwise extending direction of the third conductor lines 244 is intersected the lengthwise extending direction of the magnetoresistive structure 212 with a third angle. The third angle is greater than or equal to 0 degree and smaller than or equal to 90 degrees. The third conductor lines 244 are electrically connected with the first conductor lines 206. The fourth insulating layer 256 is formed on both the second insulating layer 218 and the second conductor lines 220. The fourth conductor lines 252 are formed at the same level as the fourth insulating layer 256 and arrange in the form of single layer. A lengthwise extending direction of the fourth conductor lines 252 is intersected the lengthwise extending direction of the magnetoresistive structure 212 with a fourth angle. The fourth angle is greater than or equal to 0 degree and smaller than or equal to 90 degrees. The fourth conductor lines 252 are electrically connected with the second conductor lines 220.

In addition, in order to achieve more effective connections between the layer of conductor lines and the magnetoresistive layer 208 and between the layers of conductor line, the first insulating layer 204 is further formed with first via-filled conductors 222 therein to electrically connect the magnetoresistive structure 212 with the first conductor lines 206. The third insulating layer 246 further is formed with third via-filled conductors 242 therein to electrically connect the first conductor lines 206 with the third conductor lines 244. The second insulating layer 218 further is formed with fourth via-filled conductors 254 therein to electrically connect the second conductor lines 220 with the fourth conductor lines 252.

Figure 10B:
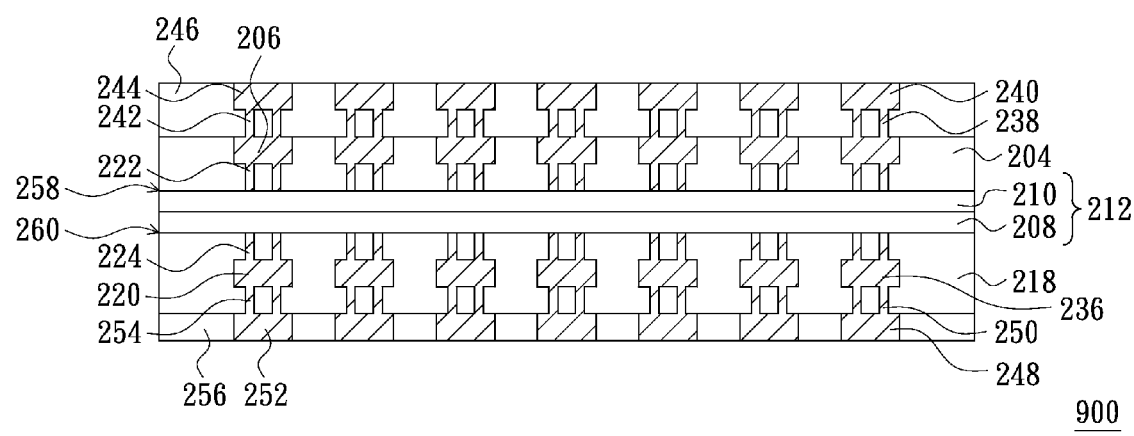

FIG. 10B shows a schematic cross-sectional view of a magnetoresistive sensor in accordance with a second implementation of the third embodiment of the present invention. As illustrated in FIG. 10B, in the magnetoresistive sensor 900, the second insulating layer 218 further is formed with second via-filled conductors 224 therein to electrically connect the magnetoresistive structure 212 with the second conductor lines 220. Of course, in the magnetoresistive sensor 900, the magnetoresistive structure 212 can be directly electrically connected with the second conductor lines 220 (see FIG. 10A) instead. The first conductor lines 206, the second conductor lines 220, the third conductor lines 244, the fourth conductor lines 252, the first via-filled conductors 222, the second via-filled conductors 224, the third via-filled conductors 242 and the fourth via-filled conductors 254 may be made of aluminum, tungsten or copper and so on, or one of combinations thereof. The first insulating layer 204, the second insulating layer 218, the third insulating layer 246 and the fourth insulating layer 256 may be silicon oxide layers or silicon nitride layers, etc.

Figure 1:
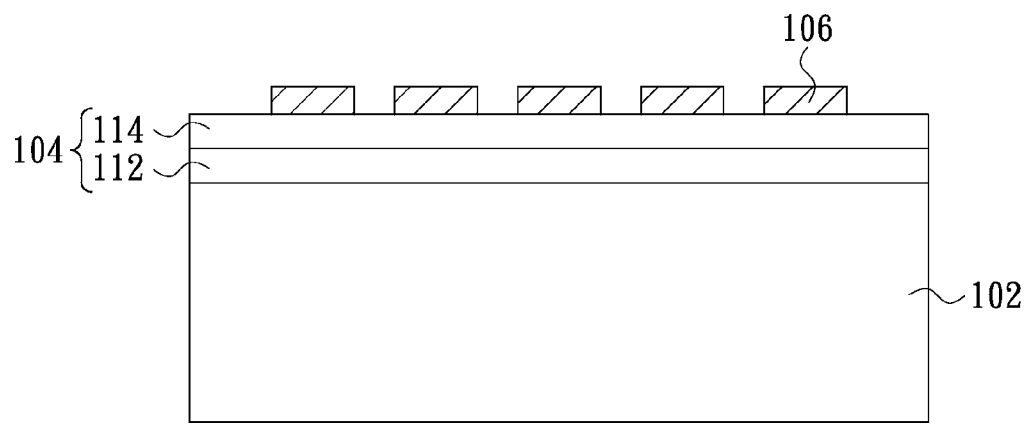
FIG. 1 shows a schematic cross-sectional view of a conventional magnetoresistive sensor.
Figure 2:
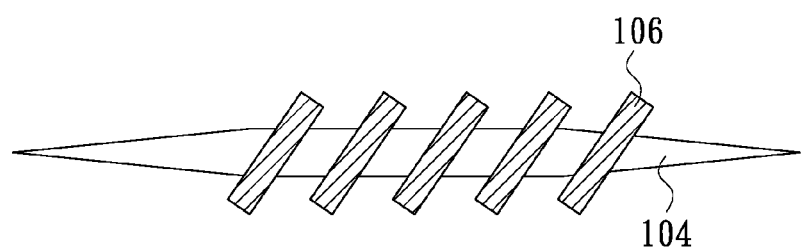
FIG. 2 shows a schematic top view of the magnetoresistive sensor as shown in FIG. 1.
Figure 10C:
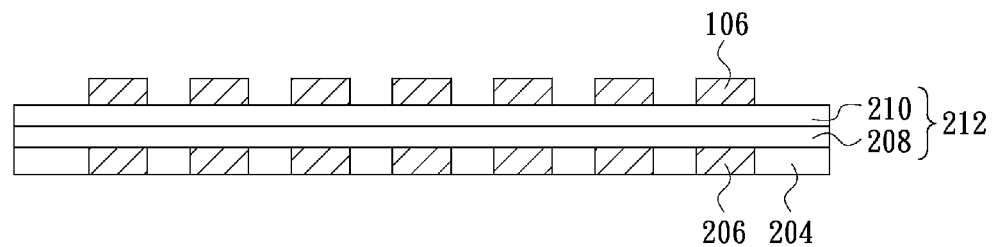

It can be understood that, the combination of FIG. 1 and FIG. 3A can be as another implementation of the third embodiment of the present invention, the resultant structure can refer to FIG. 10C.

Figure 11A:
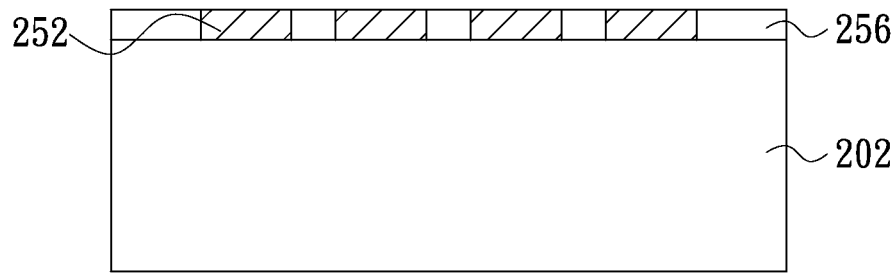
FIGS. 11A through 11E show schematic cross-sectional views of exemplary sequentially formed base structures for fabricating a magnetoresistive sensor of the present invention.

In order to more clearly illustrate the present invention, an exemplary method for fabricating one of the foregoing magnetoresistive sensors will be described below in detail. FIGS. 11A through 11E shows schematic cross-sectional views of exemplary sequentially formed base structures for fabricating a magnetoresistive sensor of the present invention. As illustrated in FIG. 11A, a fourth insulating layer 256 is formed a substrate 202, the fourth insulating layer 256 is etched to form fourth slots (not labeled) therein, the fourth slots then are filled with a conductive material (e.g., tungsten, or copper) and thereby the fourth conductor lines 252 are formed after chemical polishing process. The lengthwise extending direction of the fourth conductor lines 252 is intersected the lengthwise extending direction of the magnetoresistive structure 212 (referring to the below description) with a second angle. The second angle is greater than or equal to 0 degree and smaller than or equal to 90 degrees.

Of course, the forming process of the conductor lines also can be that: a layer of conductive material 252 (e.g., aluminum) is firstly formed on the substrate 202, a metal etching process then is carried out, and finally an insulating layer 256 is filled and then a planarizing process is performed. As a result, the structure as illustrated in FIG. 11A can be obtained according to such forming process. It is indicated that such forming process of conductor lines will not be repeated below.

Figure 11B:
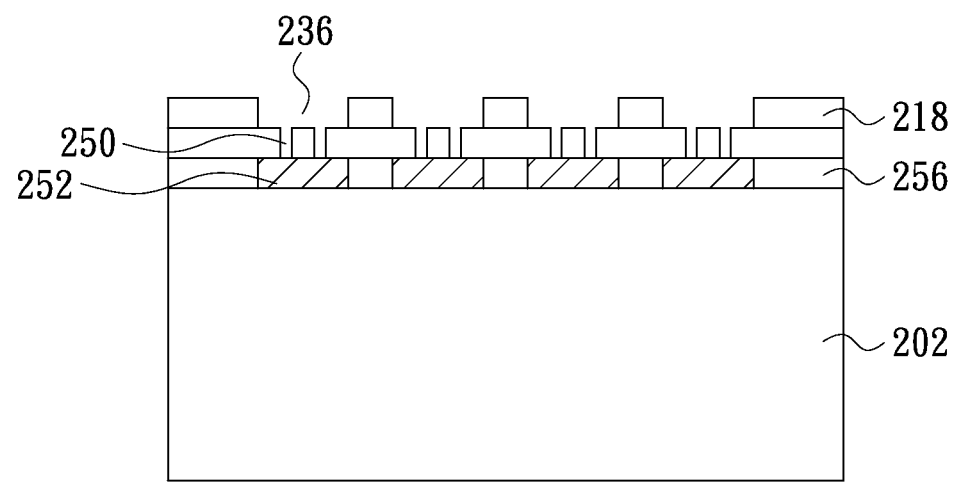

Subsequently, as illustrated in FIG. 11B, a second insulating layer 218 is formed on both the fourth insulating layer 256 and the fourth conductor lines 252 by damascene technology. The second insulating layer 218 then is etched to form fourth vias 250 and second slots 236.

Figure 11C:
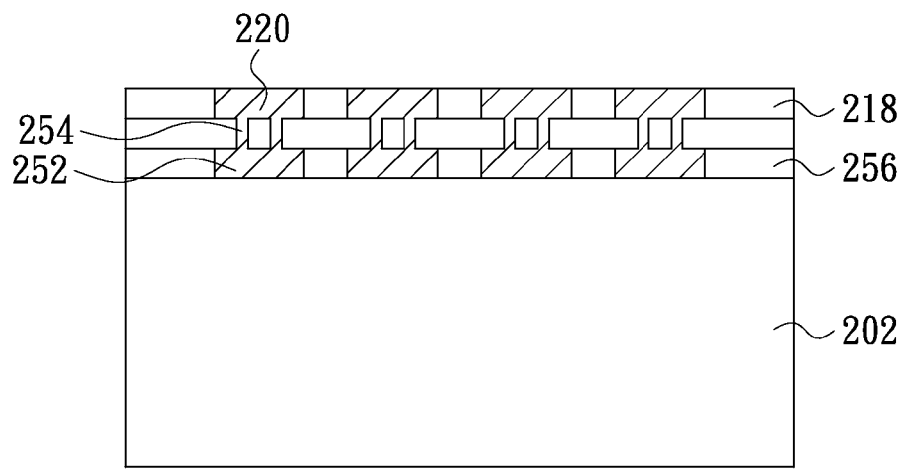

As illustrated in FIG. 11C, the fourth vias 250 and the second slots 236 are firstly filled with a conductive material and then a planarizing process is performed, so as to form fourth via-filled conductors 254 and second conductor lines 220.

Figure 11D:
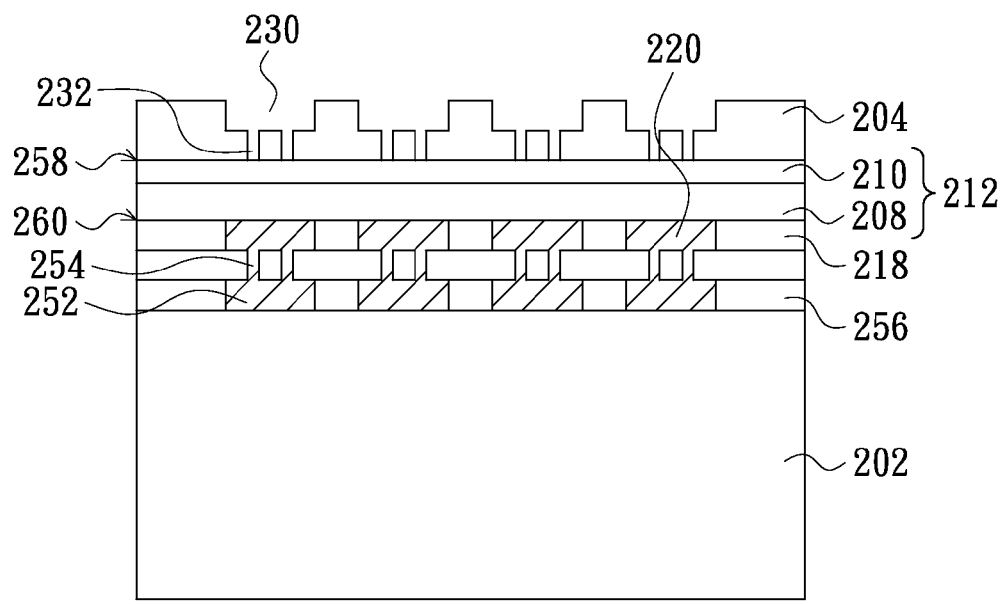

Afterwards, as illustrated in FIG. 11D, a magnetoresistive structure 212 is formed on the layer of second conductor lines 220. The magnetoresistive structure 212 includes a magnetoresistive layer 208 and a hard mask layer 210. A first insulating layer 204 then is formed on the magnetoresistive structure 212. Afterwards, the insulating layer 204 is etched to form first vias 232 and first slots 230.

Figure 11E:
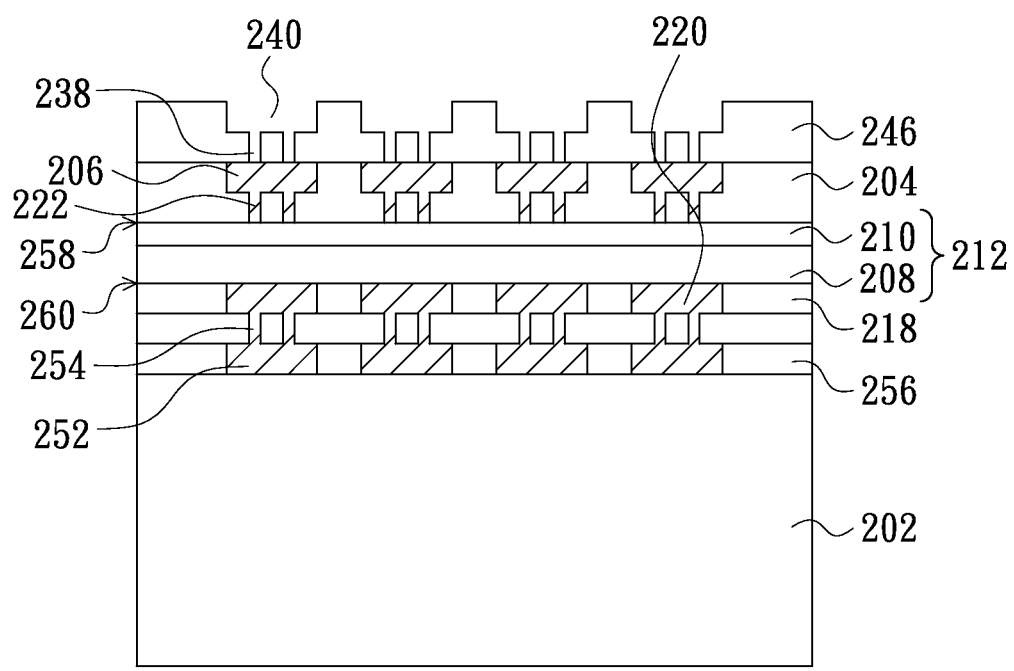

As illustrated in FIG. 11E, the first vias 232 and the first slots 230 in the first insulating layer 204 are firstly filled with a conductive material (such as tungsten or copper) and then a planarizing process is performed, so as to form first via-filled conductors 222 and first conductor lines 206. A lengthwise extending direction of the first conductor lines 206 is intersected a lengthwise extending direction of the magnetoresistive structure 212 with a first angle. The first angle is greater than or equal to 0 degree and smaller than or equal to 90 degrees. The first conductor lines 206 are arranged in the form of single layer and electrically connected to the magnetoresistive structure 212 by the first via-filled conductors 222. Afterwards, a third insulating layer 246 is formed on both the first insulating layer 204 and the first conductor lines 206. The third insulating layer 246 then is etched to sequentially form third vias 238 and third slots 240.

Finally, the third vias 238 and the third slots 240 in the third insulating layer 246 are firstly filled with a conductive material and then a planarizing process is performed, so as to form the third via-filled conductors 242 and the third conductor lines 244, the resultant structure after removing the substrate 202 can refer to FIG. 10A. A lengthwise extending direction of the third conductor lines 244 in the third insulating layer 246 is intersected the lengthwise extending direction of the magnetoresistive structure 212 with a second angle. The second angle is greater than or equal to 0 degree and smaller than or equal to 90 degrees. The third conductor lines 244 are arranged in the form of single layer and electrically connected to the first conductor lines 206 by the third via-filled conductors 242. The substrate 202 can be an insulating substrate or other substrate with extremely large resistance. The first conductor lines 206, the second conductor lines 220, the third conductor lines 244, the fourth conductor lines 252, the first via-filled conductors 222, the third via-filled conductors 242 and the fourth via-filled conductors 254 may be made of aluminum, tungsten, or copper and so on, or any one of combinations thereof. The first insulating layer 204, the second insulating layer 218, the third insulating layer 246 and the fourth insulating layer 256 may be silicon oxide layers, or silicon nitride layers, etc.

It is noted that, the present invention can use different conductor lines and fabrication process thereof to increase the performance of the magnetoresistive sensor and improve the production manner. Accordingly, in the illustrated structures of various embodiments, the conductive layers (including the layers of conductor line and the layers of via-filled/trench-filled conductor) may have different combinations, and the amount of the conductive layers connected together is not limited to the foregoing illustrations.

In summary, for the magnetoresistive sensor of the present invention, since the general semiconductor devices such as the conductor lines are firstly formed on the substrate, and then the semiconductor devices with the substrate together are loaded in a machine for the fabrication of the magnetoresistive structure on the conductor lines, which can avoid the metallic pollution issue of magnetic material such as iron, cobalt and nickel in the machine for performing subsequent process after the magnetoresistive structure is firstly formed on the substrate in the prior art, and also can avoid the change of temperature and/or stress in the subsequent process, the etching process or the lithography process, etc. to influence the reliability of the magnetoresistive structure.

Furthermore, in the foregoing magnetoresistive sensors, since the first insulating layer is formed on the substrate, the first conductor lines are formed at the same level as the first insulating layer, and the magnetoresistive structure then is formed on both the first insulating layer and the first conductor lines, the hard mask layer in the magnetoresistive structure is no longer needed to provide the function of connecting the magnetoresistive structure to the first conductor lines like the conventional hard mask layer, and therefore the hard mask layer in the illustrative embodiments can be made of an insulating material and not limited to the conductive material.

In addition, in the magnetoresistive sensor of the present invention, the hard mask layer only is needed for defining the magnetoresistance layer and no longer needed to resist from the etching of defining the conductor lines, and therefore the hard mask layer may have a thinner thickness with respect to that in the conventional magnetoresistive structure. Accordingly, the magnetoresistive structure with a thinner hard mask layer can improve the sensitivity of sensing the change of external magnetic field.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A magnetoresistive sensor comprising:
a substrate;
a first insulating layer, formed on the substrate;
a plurality of individual first conductor lines, formed at a level of the first insulating layer and in the form of discontinuous layer, and whereby the plurality of individual first conductor lines are separated from one another by the first insulating layer; and
a magnetoresistive structure, formed on the first insulating layer and the plurality of individual first conductor lines, and whereby the first insulating layer and the plurality of individual first conductor lines are arranged between the substrate and the magnetoresistive structure, wherein a lengthwise extending direction of the magnetoresistive structure is obliquely intersected with a lengthwise extending direction of each of the plurality of individual first conductor lines, and the plurality of individual first conductor lines are electrically connected and directly in contact with the same magnetoresistive structure and respectively are a single metal layer;
wherein the magnetoresistive structure comprises:
a magnetoresistive layer, formed on the first insulating layer and the plurality of individual first conductor lines,
a hard mask layer, formed on a surface of the magnetoresistive layer facing away from the first insulating layer and the plurality of individual first conductor lines;
wherein the plurality of individual first conductor lines are electrically connected and directly in contact with the magnetoresistive layer of the magnetoresistive structure to thereby form barber-pole conductors of the magnetoresistive sensor.
2. The magnetoresistive sensor as claimed in claim 1, further comprising:

a second insulating layer, formed between the substrate and the first insulating layer with the plurality of individual first conductor lines; and a plurality of individual second conductor lines, formed at a level of the second insulating layer and in the form of discontinuous layer, wherein a lengthwise extending direction of each of the plurality of individual second conductor lines is obliquely intersected with the lengthwise extending direction of the magnetoresistive structure, the plurality of individual second conductor liens are electrically connected with the plurality of individual first conductor lines.

3. The magnetoresistive sensor as claimed in claim 2, wherein the second insulating layer further is formed with a plurality of second via-filled or trench-filled conductors therein to electrically connect the plurality of individual first conductor lines to the plurality of individual second conductor lines.

4. The magnetoresistive sensor as claimed in claim 3, wherein each of the plurality of individual first conductor lines, the plurality of individual second conductor lines and the second via-filled or trench-filled conductors is made of one of the group consisting of aluminum, tungsten, copper and combinations thereof, each of the first insulating layer and the second insulating layer is a silicon oxide layer or a silicon nitride layer.

5. The magnetoresistive sensor as claimed in claim 1, wherein the magnetoresistive structure is a continuous layer structure.

6. The magnetoresistive sensor as claimed in claim 1, wherein the magnetoresistive layer of the magnetoresistive structure is a discontinuous layer structure and comprises a plurality of individual portions, each two adjacent of the individual portions are electrically connected with each other through one of the plurality of individual first conductor lines arranged therebetween.

7. The magnetoresistive sensor as claimed in claim 1, wherein the plurality of individual first conductor lines further are in contact with the substrate.

8. A magnetoresistive sensor comprising:
a magnetoresistive structure, having a first surface and a second surface opposite to the first surface;
a first insulating layer, formed on the first surface of the magnetoresistive structure;
a plurality of individual first conductor lines, formed at a level of the first insulating layer and in the form of discontinuous layer, wherein a lengthwise extending direction of each of the plurality of individual first conductor lines is obliquely intersected with a lengthwise extending direction of the magnetoresistive structure, the plurality of individual first conductor lines are separated from one another by the first insulating layer and further are electrically connected to and directly in contact with the same magnetoresistive structure and respectively are a single metal layer;
a second insulating layer, formed on the second surface of the magnetoresistive structure; and
a plurality of individual second conductor lines, formed at a level of the second insulating layer and in the form of discontinuous layer, wherein a lengthwise extending direction of each of the plurality of individual second conductor lines is obliquely intersected with the lengthwise extending direction of the magnetoresistive structure, the plurality of individual second conductor lines are separated from one another by the second insulating layer and further are electrically connected to the same magnetoresistive structure and respectively are a single metal layer;

wherein the magnetoresistive structure comprises:
a magnetoresistive layer with the first surface, and
a hard mask layer with the second surface, formed on the magnetoresistive layer;
wherein the plurality of individual first conductor lines are electrically connected to and directly in contact with the magnetoresistive layer of the magnetoresistive structure to thereby form first barber-pole conductors of the magnetoresistive sensor;
wherein the plurality of individual second conductor lines are electrically connected to the magnetoresistive layer of the magnetoresistive structure at least through the hard mask layer to thereby form second barber-role conductors of the magnetoresistive sensor.

9. The magnetoresistive sensor as claimed in claim 8, further comprising:
a third insulating layer, formed on both the first insulating layer and the plurality of individual first conductor lines; and
a plurality of individual third conductor lines, formed at a level of the third insulating layer, wherein a lengthwise extending direction of each of the plurality of individual third conductor lines is obliquely intersected with the lengthwise extending direction of the magnetoresistive structure, the plurality of individual third conductor lines are electrically connected with the plurality of individual first conductor lines.

10. The magnetoresistive sensor as claimed in claim 9, further comprising:
a fourth insulating layer, formed on both the second insulating layer and the plurality of individual second conductor line; and
a plurality of individual fourth conductor lines, formed at a level of the fourth insulating layer, wherein a lengthwise extending direction of each of the plurality of individual fourth conductor lines is obliquely intersected with the lengthwise extending direction of the magnetoresistive structure, the plurality of individual fourth conductor lines are electrically connected with the plurality of individual second conductor lines.

11. The magnetoresistive sensor as claimed in claim 10, wherein
the third insulating layer further is formed with a plurality of third via-filled or trench-filled conductors therein to electrically connect the plurality of individual first conductor lines with the plurality of individual third conductor lines; and
the fourth insulating layer further is formed with a plurality of fourth via-tilled or trench-filled conductors therein to electrically connect the plurality of individual second conductor lines with the plurality of individual fourth conductor lines.

12. The magnetoresistive sensor as claimed in claim 11, wherein
the second insulating layer further is formed with a plurality of second via-filled or trench-filled conductors to electrically connect the magnetoresistive structure with the plurality of individual second conductor lines.

13. The magnetoresistive sensor as claimed in claim 12, wherein each of the plurality of individual first conductor lines, the plurality of individual second conductor lines, and the second via-filled or trench-filled conductors is made of one of the group consisting of aluminum, tungsten, copper and combinations thereof, each of the first insulating layer and the second insulating layer is a silicon oxide layer or a silicon nitride layer.

14. The magnetoresistive sensor as claimed in claim 8, wherein the plurality of individual second conductor lines are in contact with the magnetoresistive structure.

* * * * *